US006661106B1

(12) United States Patent
Gilmour et al.

(10) Patent No.: US 6,661,106 B1
(45) Date of Patent: Dec. 9, 2003

(54) ALIGNMENT MARK STRUCTURE FOR LASER FUSING AND METHOD OF USE

(75) Inventors: Richard A. Gilmour, Liberty Hill, TX (US); William A. Klaasen, Underhill, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/218,881

(22) Filed: Aug. 13, 2002

(51) Int. Cl.[7] ............................................. H01L 23/544
(52) U.S. Cl. ........................ 257/797; 257/665; 257/774; 257/750
(58) Field of Search ................................ 257/797, 750, 257/758, 665, 774

(56) References Cited

U.S. PATENT DOCUMENTS

| 5,869,383 | A   |   | 2/1999 | Chien et al. | 438/401 |
| 6,255,715 | B1  | * | 7/2001 | Liaw | 257/529 |
| 6,452,284 | B1  | * | 9/2002 | Sheck | 257/797 |
| 2002/0028539 | A1 | * | 3/2002 | Ema | 257/529 |
| 2002/0084487 | A1 | * | 7/2002 | Takasu | 257/347 |
| 2003/0017631 | A1 | * | 1/2003 | Yamaguchi | 438/18 |

FOREIGN PATENT DOCUMENTS

| JP | 2-65149 | * | 3/1990 | 365/399 |
| JP | 2-299251 | * | 12/1990 | 438/975 |
| JP | 3-201462 | * | 9/1991 | 438/73 |

* cited by examiner

*Primary Examiner*—Jasmine Clark
(74) *Attorney, Agent, or Firm*—Schmeiser, Olsen & Watts; William D. Sabo

(57) ABSTRACT

The present invention relates to an alignment mark structure for laser fusing. An alignment mark structure is formed which is comprised of image elements that are placed on different film layers in a semiconductor device. Alignment is accomplished by examining the difference in reflected energy of a laser beam as the beam traverses the alignment mark structure. By forming the alignment mark structure such that it has elements on different film layers, the reflected energy can be modulated to avoid the situation in which no difference in reflected energy is found, which would make the alignment mark invisible to the laser fusing tool. A method of applying the alignment mark structure is also disclosed.

33 Claims, 4 Drawing Sheets

ALIGNMENT MARK STRUCTURE FOR LASER FUSING AND METHOD OF USE

BACKGROUND OF THE INVENTION

1. Technical Field

The present invention relates generally to processes for the manufacture of semiconductor devices, and more particularly to an alignment mark structure for ultraviolet laser fusing, and a method for applying the alignment mark structure during semiconductor device manufacture.

2. Related Art

Metal link fuses are used in semiconductor integrated circuit devices to provide redundancy, electrical chip identification, and customization of wiring. For integrated circuits having three or more layers of wiring, the metal link fuses are typically formed from a segment of one of the wiring layers, e.g., the "last metal" or "last metal minus one" wiring layer. Fusing, i.e., deletion of a segment of metal link fuse line, is accomplished by exposing the segment to a short, high intensity pulse of light from a laser. The metal link fuse line absorbs energy, melts and expands, and ruptures any overlayer passivation material. The molten metal boils or vaporizes out of, and off of, its dielectric surroundings, disrupting the continuity of the metal link fuse line and causing high electrical resistance. An electrical sensing circuit is used to detect fuse segment resistance.

To improve silicon utilization, both metal fuse link size and the distance between adjacent metal fuse links must be minimized. Two of the limitations to minimizing these parameters are the diameter of the laser beam (n.b., the minimum diameter is about twice the wavelength) and the positioning accuracy of the laser beam relative to the metal fuse link. The use of lasers having shorter wavelengths achieves decreasing laser beam diameter, but positioning accuracy is driven by the ability of the laser to accurately determine the positions of relevant structural topographies, known as alignment marks. An alignment mark is an image selectively placed within or outside an array for either testing or aligning purposes, and is also known as an alignment key or an alignment target. The term "alignment," as used herein, refers to the mechanical positioning of coordinate points on a wafer substrate relative to the laser beam used to delete the metal fuse link. Accurately determining the position of an alignment mark requires that there be a high contrast between the alignment mark and the surrounding dielectric material.

SUMMARY OF THE INVENTION

It is therefore a feature of the present invention to overcome the above shortcomings related to incorrect determination of alignment marks, by providing an alignment mark structure having multiple thicknesses of dielectric material (i.e., multiple optical path lengths) over the alignment mark and in the adjacent dielectric. This approach is particularly useful for integrated circuit designs employing copper metallurgy and organic dielectric films, and provides yield enhancement at the end of the fabrication process, the very spot where yield loss is most expensive.

The present invention eliminates fusing problems due to the incorrect determination of the alignment mark position (or center line), in alignment processes using laser beams having characteristic wavelengths in the ultraviolet region, e.g., wavelengths <380 nm, by formation of a unique alignment mark structure. The alignment mark structure is comprised of a metal link fuse alignment mark structure which is surrounded and covered by one or more dielectric films, and where the alignment mark structure is composed of a substantially vertical stack of at least two metal wiring layers or levels. For example, one segment of the alignment mark structure can be formed at the last metal wiring layer (LM), and another segment of the alignment mark structure can be formed at the previous metal wiring layer (LM-1). The present invention is also drawn to a method of utilizing the alignment mark structure disclosed herein. By forming parts of the alignment mark structure at different metal wiring levels, the optical path lengths adjacent the alignment mark structures and over the alignment mark structures are different for each alignment mark structure position, thus minimizing the possibility of there being a low difference in the reflected energy (i.e, low contrast or "low visibility") between the metal link fuse and the surrounding dielectric material. In practice, the laser beam scanning apparatus of the fusing tool is programmed to look at the LM layer of the alignment mark structure first, and if there is insufficient or low contrast, then to look at the LM-1 layer of the alignment mark structure. Contrast can be defined as the range of light and dark values in a picture, or the ratio between the maximum and the minimum brightness values. Insufficient or low contrast is shown mainly as shades of gray, while high contrast is shown as blacks and whites with very little gray.

In a first general aspect, the present invention provides a semiconductor device structure that acts as an alignment mark structure for laser fusing.

In a second general aspect, the present invention provides a semiconductor integrated circuit device containing an alignment mark structure for laser fusing using a laser having a characteristic wavelength, said alignment mark structure comprising: a first metal wiring layer formed in a first layer; and a second metal wiring layer formed in a second layer, said second layer overlaying the first layer.

In a third general aspect, the present invention provides a system for aligning a semiconductor integrated circuit device for laser fusing, said system comprising: an alignment mark structure formed within at least two layers of said semiconductor integrated circuit device, said alignment mark structure containing at least one alignment mark and formed from a plurality of metal wiring layer segments distributed throughout said at least two layers and surrounded by a first material; a scanning device comprising a laser beam, said scanning device capable of targeting said laser beam at a surface of said semiconductor integrated circuit device beneath which said alignment mark structure is located; a device for determining the reflected energy from said alignment mark structure and said surrounding first material; and a device for accurately determining the position of said alignment mark structure from said reflected energy.

In a fourth general aspect, the present invention provides a method of making an alignment mark structure for use with a laser fusing device, said method comprising the steps of: a) providing a substrate layer; b) depositing a base layer on said substrate layer; c) depositing a first layer on said base layer; d) forming a first metal wiring layer in said first layer; e) depositing a second layer on said first layer and said first metal wiring layer; and f) forming a second metal wiring layer on said second layer.

The foregoing and other features and advantages of the invention will be apparent from the following more particular description of embodiments of the invention.

BRIEF DESCRIPTION OF THE DRAWINGS

The features and inventive aspects of the present invention will become more apparent upon reading the following detailed description, claims, and drawings, of which the following is a brief description.

DETAILED DESCRIPTION OF THE EMBODIMENTS

Figure 1:
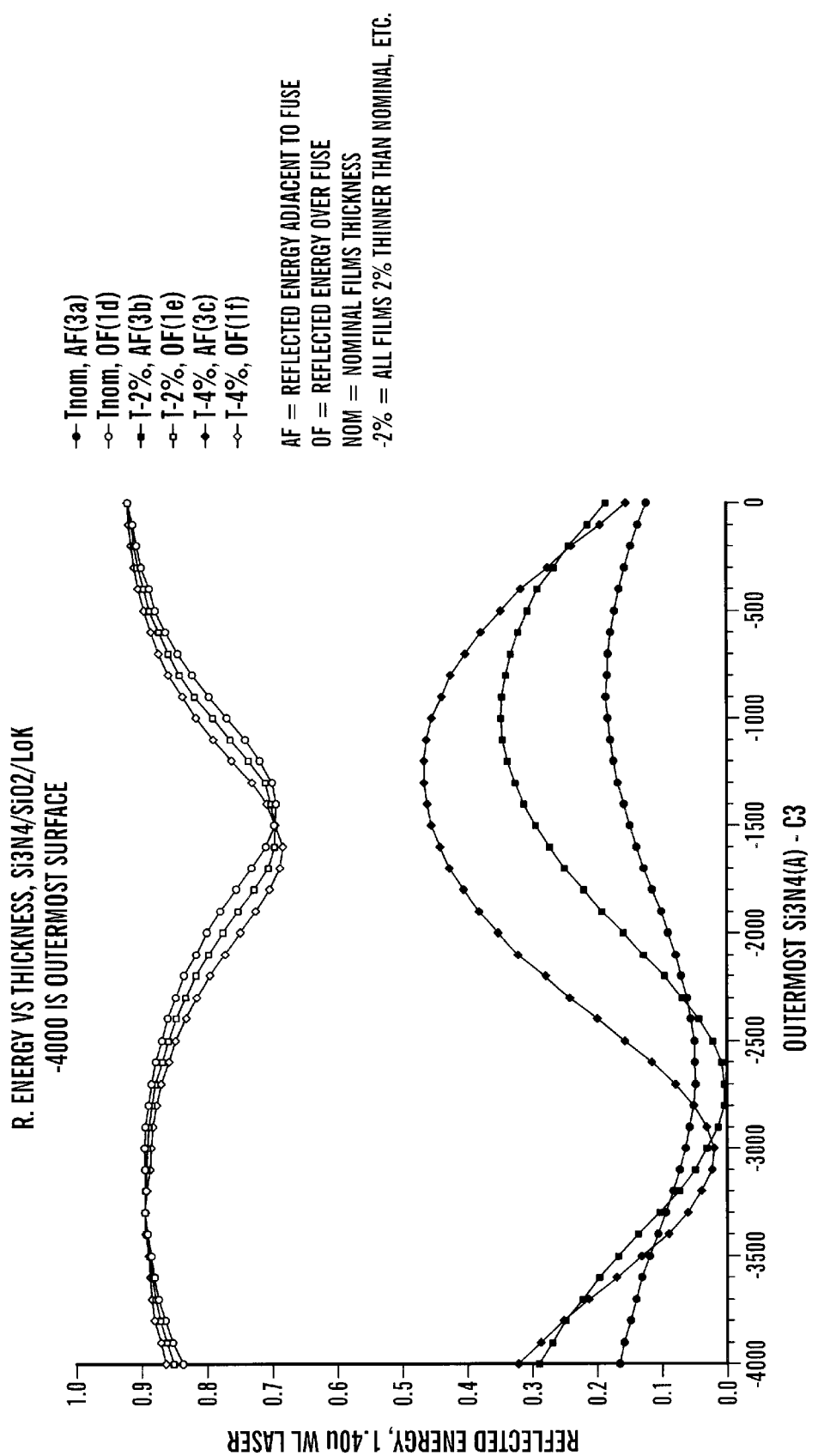
FIG. 1 is a graphical representation of reflected energy versus thickness of a typical structure and a 1.4 micron wavelength infrared (IR) laser of the related art.

The following is a detailed explanation of the alignment mark structure, a method for using the improved alignment mark structure, and a method for manufacturing the alignment mark in embodiments of the present invention with reference to the attached drawings. It should be noted that the same reference numbers are assigned to components having approximately the same functions and structural features in the following explanation and the attached drawings to preclude the necessity for repeated explanation thereof.

Successful deletion of metal link fuses in a semiconductor integrated circuit device requires precise alignment of the laser beam to the metal link fuse. This alignment is typically accomplished by "x" and "y" directional scanning of at least three alignment marks which are positioned around the perimeter of the semiconductor chip or reticle field. The "x" and "y" origin and the semiconductor chip rotation are calculated and used by the fusing tool, together with previously input metal link fuse locations (e.g., relative to the origin), to align the laser beam with the metal link fuse. The directional scanning is typically (although not necessarily) performed through the same tool optics that are used for subsequent fusing, employing the monochromatic laser beam which is used for the metal fuse link deletion, but at a much reduced power level. Once the origin and the rotation are determined, a precision motion table, e.g. an interferometer table, or laser beam deflection system, positions each of the metal fuse link which are to be deleted, under the laser beam. The laser is activated and the metal fuse link is deleted.

Efficient alignment mark scanning requires the determination of a difference in the energy reflected from the dielectric stack surrounding the alignment mark, and from the alignment mark itself. The difference in reflected energy allows the edges of the alignment mark to be clearly distinguished, and from these edges the center line of the alignment mark can be determined. If there is an insufficient difference in the reflected energy between these two regions, the fusing tool either aborts attempting to fuse that chip and moves to the next chip, or makes an incorrect "guess" of the position of the alignment mark center line, which typically results in imperfect deletion of the metal fuse link. The amount of energy reflected is determined by the optical properties of the film stacks adjacent to the metal fuse link and over the metal fuse link itself, as well as by the wavelength of the laser beam. Infrared (IR) wavelengths, such as the 1.3 micron wavelength currently being used in advanced logic (i.e., copper) fusing tools, are relatively insensitive to changes in optical path length (e.g., tolerances associated with the thickness of each of the films in the dielectric stack). As fusing tools move to wavelengths in the deep UV regions (e.g., <380 nm), to achieve smaller spot sizes and ablation mode deletion, sensitivity to changes in film thickness becomes severe. This problem is compounded by the inclusion of organic dielectric films in the film stacks, as they typically have indices of refraction and absorption coefficients different than the commonly used silicon dioxide and silicon nitride films.

Figure 2:
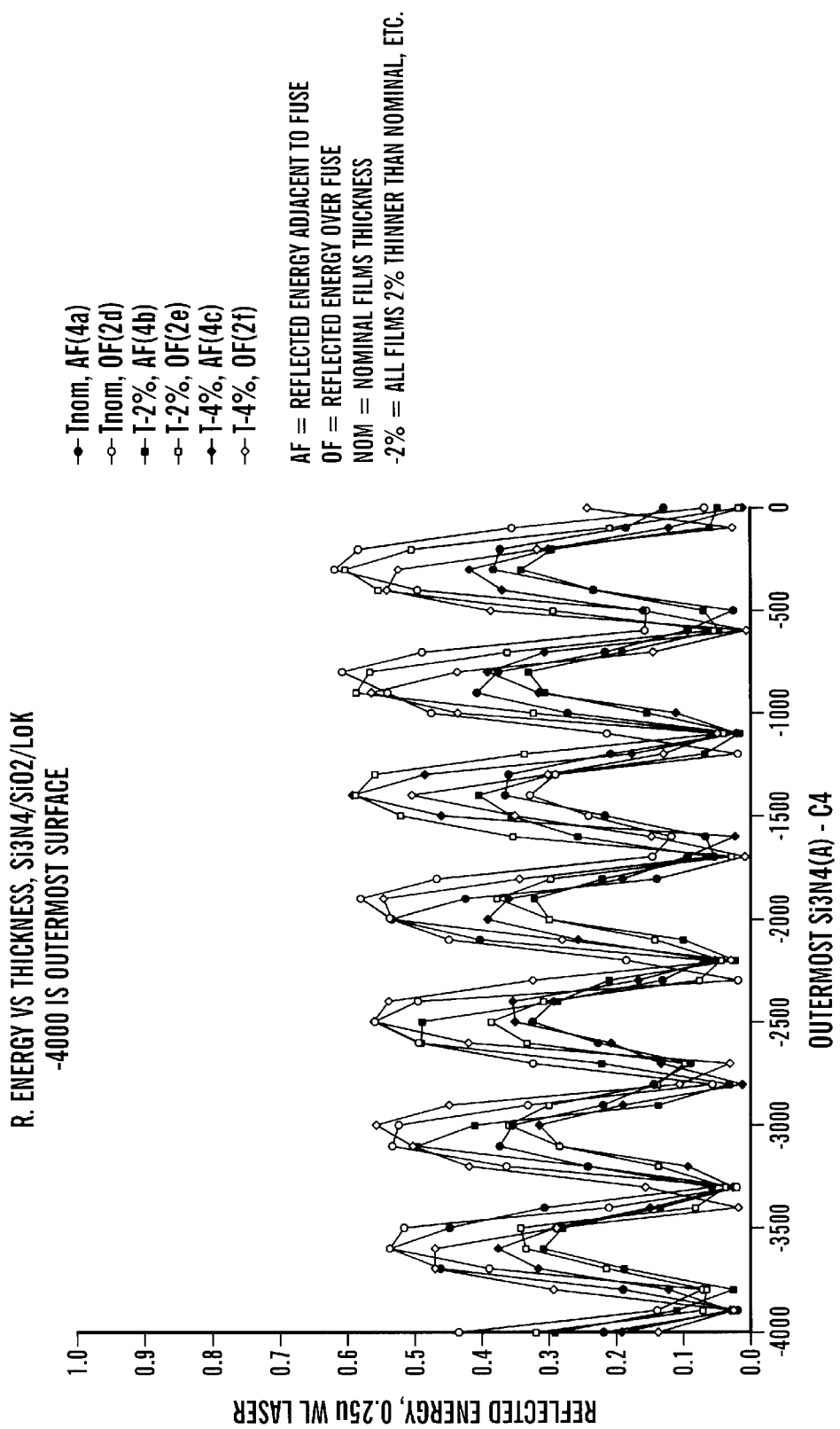
FIG. 2 is a graphical representation of reflected energy versus thickness of a typical structure and a 0.25 micron wavelength ultraviolet (UV) laser of the related art.

FIGS. 1 and 2 show the calculated reflected energies for similar film stacks and copper alignment marks as viewed with infrared (FIG. 1) and deep ultraviolet (UV) wavelengths (FIG. 2). For the same change in film thickness, the shorter UV wavelengths go through a higher number of reflectivity maxima and minima (i.e., there are more incidences of low contrast between the alignment mark and the surrounding dielectric material) than experienced with infrared wavelengths.

Figure 3:
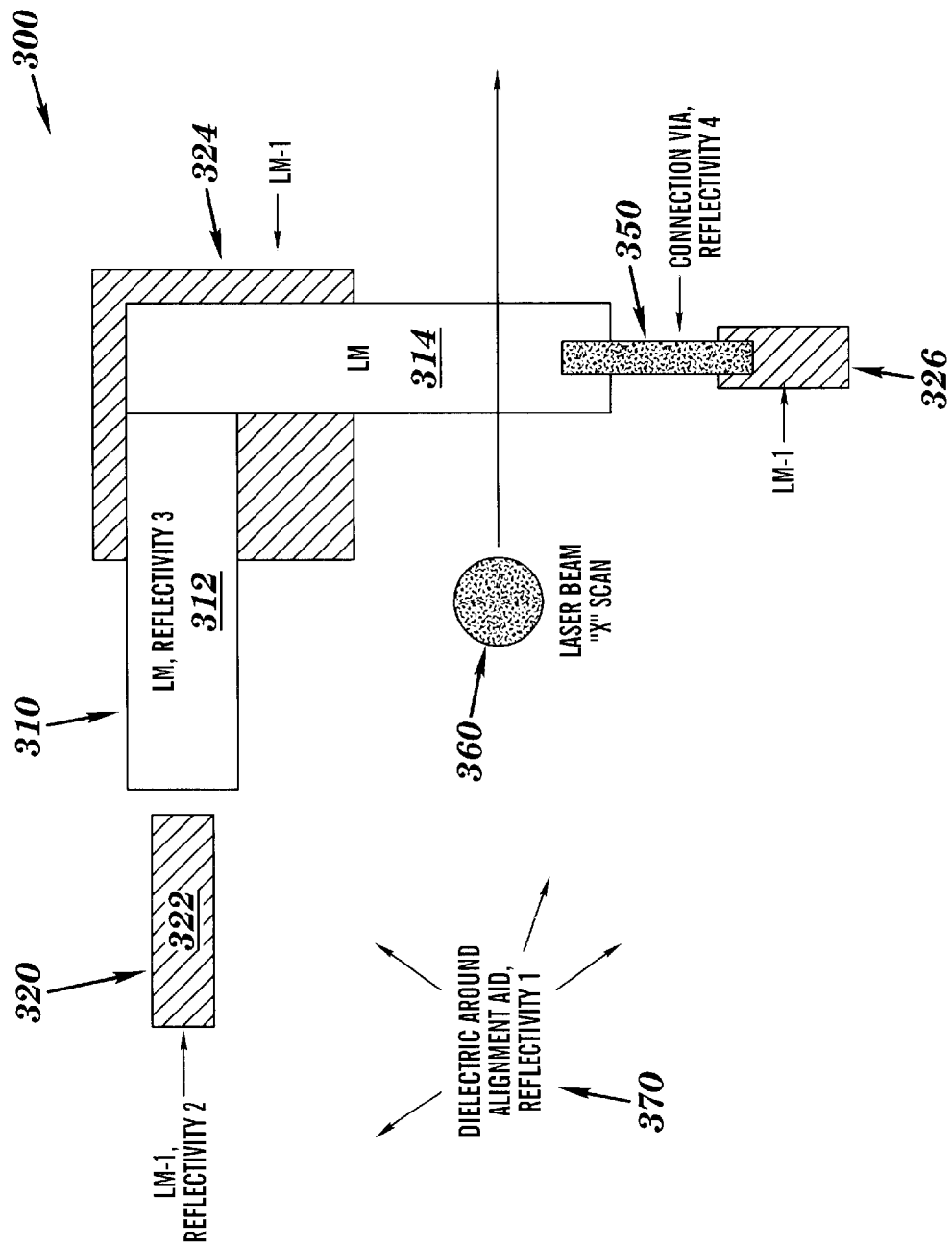
FIG. 3 is a plan view of a first embodiment of an alignment mark structure in accordance with an embodiment of the present invention.

FIG. 3 shows a plan view of a first embodiment of an alignment mark structure 300, e.g., a deep ultraviolet alignment mark. Note that throughout this disclosure, the singular term "layer" is used for clarity. However, each metal or dielectric layer may be comprised of a plurality of layers, as in, for example, a damascene metal layer. Metal wiring layer 310 is a last metal wiring layer (LM) and, in this example, includes two LM segments 312, 314. Metal wiring layer 320 is a last metal minus one wiring layer (LM-1) and, in this example, includes three LM-1 segments, namely 322, 324, and 326. The metal wiring layer segments 310, 320 are arranged in an orthogonal manner so that "x" and "y" locations can be determined. Last metal wiring layer 310 and last metal minus one wiring layer 320 may be formed from the same metal, or different metals. The connection via 350 connecting LM 314 to LM-1 326 may also be formed from the same metal, or a different metal, than the metal(s) used to form LM 310 and LM-1 320. These metals may be comprised of one or more of copper, aluminum, tungsten, tantalum, titanium, tantalum nitride, titanium nitride, or other metals commonly used for semiconductor integrated circuit wiring. A dielectric material 370, which may be comprised of one or more of silicon dioxide, silicon nitride, fluorinated silicon dioxide, porous silicon dioxide, or other dielectrics commonly used as semiconductor integrated circuit dielectrics, surrounds and covers the overall structure of the deep ultraviolet alignment mark structure 300.

In a damascene copper embodiment, for example, at metal wiring layer LM-1 320, damascene copper line segments 322, 326 are formed that will become extensions to the "x" and "y" segments together with underplate 324 for the alignment mark structure formed at metal wiring layer LM 310.

At metal wiring layer LM 310, damascene copper line segments 312, 314 are formed that define the alignment mark structure, where the segments 322, 326 formed at metal wiring layer LM-1 are centered on the segments 312, 314 of the metal wiring layer LM, and over the metal wiring layer LM-1 underplate 324 as shown in FIG. 3. The segments 312, 314 of the metal wiring layer LM alignment mark structure can be the same width or a different width than the segments 322, 326 formed at metal wiring layer LM-1.

If a dual damascene process is used, a connection via 330 can be placed connecting the metal wiring layers LM 310 and LM-1 320 alignment mark structure segments. Similarly, if a single damascene process is used for metal wiring layer LM and the via layers connecting metal wiring layer LM to metal wiring layer LM-1, a connection via, (e.g., a stud via) 330 can be placed to form a connection between the metal wiring layer LM 310 and metal wiring layer LM-1 320 levels of the alignment mark structure segments 314, 326. The alignment mark structure segments may be attached or detached as shown in FIG. 3. Additional levels of alignment mark structure target segments can be formed by repeating the steps described above.

A laser beam 360, of desired wavelength, (for example, <380 nm wavelength) is scanned across the alignment mark structure using machinery (not shown) widely known in the art. As the laser beam 360 is scanned across the alignment mark structure 300, differences are detected in the reflected energy between the alignment mark structure's wiring segments 310, 320 and the surrounding dielectric 370. The maximum differences in the reflected energy are found at the edges of the metal wiring segments 310, 320, where the reflectivity changes abruptly. The maximum differences can be measured by, for example, photomultiplier or polarization techniques, and the geometric centerline of the alignment mark 300 can be calculated. In this way a reference value for the location of the alignment marks can be determined.

Figure 4:
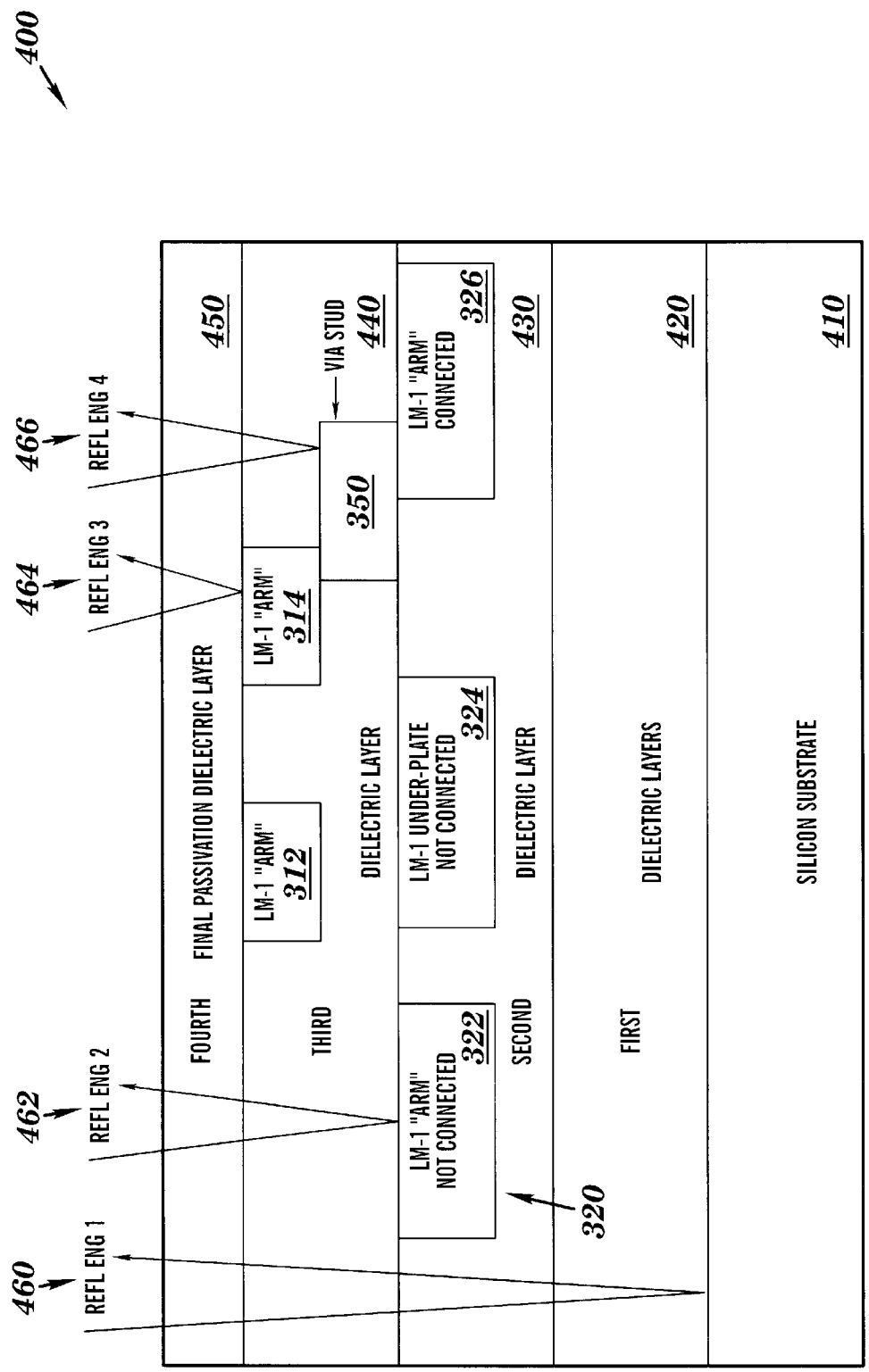
FIG. 4 is a side cross-sectional view of a semiconductor device incorporating an alignment mark structure in accordance with the present invention.

Referring now to FIG. 4, a cross-sectional view of a deep UV alignment mark structure is shown in accordance with the present invention. Semiconductor device 400 comprises a substrate base layer 410, which may be a silicon substrate, and upon which is deposited a first dielectric layer 420, using techniques known in the art. The first dielectric layers 420 are covered by depositing a subsequent dielectric layer 430. The dielectric layer 430 includes last metal minus one wiring layer (LM-1) 320 which comprises a first LM-1 segment 322, a LM-1 underplate 324, and a second LM-1 segment 326. Dielectric layer 440 is deposited over dielectric layer 430 and the last metal minus one wiring layer (LM-1) 320. Dielectric layer 440 includes last metal wiring layer (LM) 310 which comprises a first LM segment 312 and a second LM segment 314. Dielectric layer 440 also includes connection via 350 which connects second LM segment 314 to second LM-1 segment 326. Finally, an optional dielectric layer 450 may be applied over dielectric layer 440. Dielectric layer 450 functions as a final passivation dielectric layer, however, a valid alignment mark structure can be had without dielectric layer 450.

Reflected energy (1) 460 represents energy reflected off of silicon substrate 410. Reflected energy (2) 462 is the energy reflected off of LM-1 segment 322. Reflected energy (3) 464 is the energy reflected off of second LM segment 314. Reflected energy (4) 466 is the energy reflected off of the connection via.

For lasers operating in the ultraviolet (<380 nm) wavelength regions, small changes in film thickness can have a large impact on reflected energy and therefore increase the probability of having the same amount of reflected energy from both the alignment mark and the area surrounding the alignment mark. By providing alignment marks at multiple optical depths, alignment can be accomplished by performing multiple comparisons and picking the combination having the highest contrast. The multiplicity of alignment marks insures that there will always be a combination having enough contrast to efficiently perform an accurate alignment.

In practice, reflected energies 460 and 464 are compared, and if sufficient contrast exists, the alignment process proceeds. If there is not enough contrast between reflected energies 460 and 464, then reflected energies 460 and 462 are compared. Again, if sufficient contrast exists, alignment proceeds. If there is not enough contrast between reflected energies 460 and 462, then reflected energies 462 (this time from the LM-1 underplate 324) and 464 are compared. In a similar manner, reflected energies 460 and 466 can be compared.

The number of layers and segments can be increased to contain as many layers as desired, but two alignment marks located at different layers (e.g., LM and LM-1), and a surrounding field provide the minimum alignment mark structure and are the easiest combination to implement in the manufacture of an integrated circuit semiconductor device.

Embodiments of the present invention have been disclosed. A person of ordinary skill in the art would realize, however, that certain modifications would come within the teachings of this invention. Therefore, the following claims should be studied to determine the true scope and content of the invention.

What is claimed is:

1. A semiconductor device structure that acts as an alignment mark structure for laser fusing, wherein the alignment mark structure comprises two or more metal wiring layers, and wherein the alignment mark structure comprises at least one metal wiring layer formed with a damascene process.

2. The alignment mark structure of claim 1, wherein the alignment mark structure further comprises conductive interconnections between at least two of the metal wiring layers.

3. The alignment mark structure of claim 1, wherein the metal wiring layers comprise one or more metals including copper.

4. A semiconductor device structure that acts as an alignment mark structure for laser fusing, the alignment mark structure further comprising:

a characteristic fusing wavelength;

a first metal wiring layer having at least one first wiring segment;

a second metal wiring layer underlaying the first metal wiring layer and having at least one second wiring segment; and wherein said first wiring segment and said second wiring segment are separated by a distance equal to, or less than, one half the fusing wavelength.

5. The alignment mark structure of claim 4, wherein said first wiring segment and said second wiring segment are arranged in an orthogonal manner.

6. A semiconductor device structure that acts as an alignment mark structure for laser fusing, wherein the alignment mark structure comprises two or more metal wiring layers, the alignment mark structure further comprising:

a first metal wiring layer having at least one first wiring segment;

a second metal wiring layer underlaying the first metal wiring layer and having at least one second wiring segment; and wherein the second metal wiring layer further includes a metal underplate.

7. A semiconductor device structure that acts as an alignment mark structure for laser fusing, wherein the alignment structure comprises a last metal wiring layer and a previous metal wiring layer.

8. A semiconductor device structure that acts as an alignment mark structure for laser fusing, wherein the alignment mark structure comprises two or more metal wiring layers, and wherein the two or more metal wiring layers comprise a stack.

9. A semiconductor device structures acts as an alignment mark structure for laser fusing, wherein the alignment mark structure further comprises at least one metal fuse link.

10. A semiconductor intergrated circuit device containing an alignment mark structure for laser fusing using a laser having a characteristic wavelength, said alignment mark structure comprising:
- a first metal wiring layer formed in a first layer; and
- a second metal wiring liver formed in a second layer, said second layer overlaying the first layer; and
- wherein said first metal wiring level and said second metal wiring level arm formed with a damascene fabrication process.

11. The alignment mark structure of claim 10, wherein said first metal wiring layer and said second metal wiring layer are connected by at least one conductive connection via.

12. The alignment mark structure of claim 10, wherein at least one of said first metal wiring layer and said second metal wiring layer each further comprises a plurality of segments.

13. The alignment mark structure of claim 12, wherein said segments of said first metal wiring layer and said segments of said second metal wiring layer are separated by a distance, said distance equal to or less than one-half the wavelength of the fusing wavelength.

14. The alignment mark structure of claim 10, wherein at least one of said first metal wiring layer and said second metal wiring layer further comprise a metal alloy.

15. The alignment mark structure of claim 14, wherein said metal alloy includes copper.

16. The alignment mark structure of claim 10, wherein said first metal wiring layer further comprises a metal underplate.

17. The alignment mark structure of claim 10, wherein a final passivation layer of dielectric material overlays said second layer.

18. The alignment mark structure of claim 10, wherein the first and second layers are dielectric material.

19. A system for aligning a semiconductor integrated circuit device for laser fusing, said system comprising:
- an alignment mark structure formed within at least two layers of said semiconductor integrated circuit device, said alignment mark structure containing at least one alignment mark and formed from a plurality of metal wiring layer segments distributed throughout said at least two layers and surrounded by a first material;
- a scanning device comprising a laser beam, said scanning device capable of targeting said laser beam at a surface of said semiconductor integrated circuit device beneath which said alignment mark structure is located;
- a device for determining the reflected energy from said alignment mark structure and said surrounding first material;
- a device for measuring a contrast level, from said reflected energy, between said alignment mark structure and said surrounding first material;
- a device for selectively guiding the scanning device to scan a different layer when said contract level is low; and
- a device for accurately determining the position of said alignment mark structure from said reflected energy.

20. The system of claim 19, wherein said laser beam has a characteristic wavelength in the ultraviolet wavelength range.

21. The system of claim 20, wherein said alignment mark structure presents multiple optical paths, having different optical path lengths, to the laser beam.

22. The system of claim 21, wherein the device for determining the reflected energy compares the reflected energy of a pair of multiple optical paths and determines the amount of contrast between the pairs of multiple optical paths.

23. The system of claim 19, wherein said first material is a dielectric material.

24. A method of making an alignment mark structure for use with a laser fusing device, said method comprising the steps of:
- a) providing a substrate layer;
- b) depositing a base layer on said substrate layer;
- c) depositing a first layer on said base layer;
- d) forming a first metal wiring layer in said first layer;
- e) depositing a second layer on said first layer and first metal wiring layer; and
- f) forming a second metal wiring layer on said second layer; and
- wherein said first metal wiring layer and said second wiring layer are formed in segments.

25. The method of claim 24, wherein said base layer is a dielectric layer.

26. The method of claim 24, wherein said first layer is a dielectric layer.

27. The method of claim 24, wherein said second layer is a dielectric layer.

28. The method of claim 24, wherein said substrate is a silicon substrate.

29. The method of claim 24, wherein step f) further comprises forming a connection via to connect said first metal wiring layer and said second metal wiring layer.

30. The method of claim 24, wherein said first metal wiring layer and said second wiring layer are arranged in an orthogonal manner.

31. The method of claim 24, wherein said first metal wiring layer and said second wiring layer are separated by a separation distance, said laser having a characteristic wavelength, and said separation distance is equal to or less than one-half the characteristic wavelength of the laser.

32. The method of claim 24, wherein step f) is followed by:
- g) depositing a final layer of material on said second layer and said second metal wiring layer.

33. The method of claim 32, wherein the final layer is a passivation layer of dielectric material.

* * * * *